United States Patent [19]

Yoshinaka et al.

[11] 4,016,006
[45] Apr. 5, 1977

[54] METHOD OF HEAT TREATMENT OF WAFERS

[75] Inventors: Akira Yoshinaka, Tokyo; Takaaki Aoshima; Yoshimitsu Sugita, both of Kokubunji, all of Japan

[73] Assignee: Hitachi, Ltd., Japan

[22] Filed: Mar. 16, 1976

[21] Appl. No.: 667,452

Related U.S. Application Data

[63] Continuation-in-part of Ser. No. 627,368, Oct. 30, 1975, abandoned.

[30] Foreign Application Priority Data

Oct. 30, 1974 Japan .......................... 49-124415

[52] U.S. Cl. ................. 148/1.5; 148/175; 148/189
[51] Int. Cl.² ................................... H01L 21/324
[58] Field of Search .................... 148/1.5, 187, 189

[56] References Cited

UNITED STATES PATENTS

| 3,808,674 | 5/1974 | Francombe et al. | 148/175 X |
| 3,936,328 | 2/1976 | Nakata | 148/1.5 X |
| 3,939,017 | 2/1976 | Ryugo et al. | 148/189 |
| 3,972,838 | 8/1976 | Yamashita et al. | 148/189 X |

*Primary Examiner*—L. Dewayne Rutledge
*Assistant Examiner*—J. M. Davis
*Attorney, Agent, or Firm*—Craig & Antonelli

[57] ABSTRACT

In a method of heat-treating a number of wafers each of which consists of a substance of poor heat conduction and a semiconductor layer formed on one surface of the substance, a method of heat treatment of wafers characterized in that the heat treatment is carried out under the state under which an auxiliary wafer made of a substance of good heat conduction is held in proximity to the other surface of the substance of poor heat conduction, whereby the wafers for the heat treatment are prevented from being cracked and have the characteristics made uniform.

8 Claims, 5 Drawing Figures

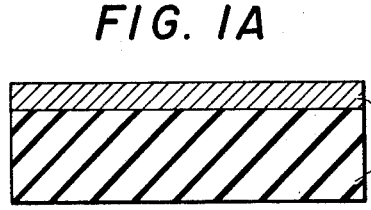
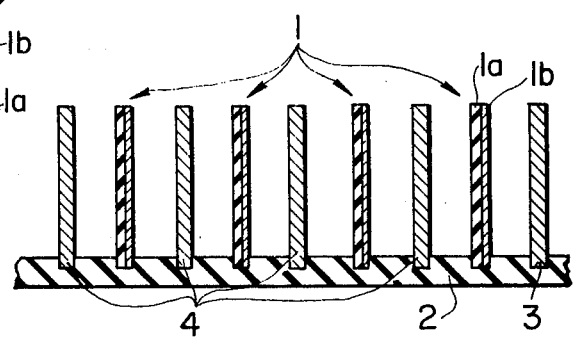
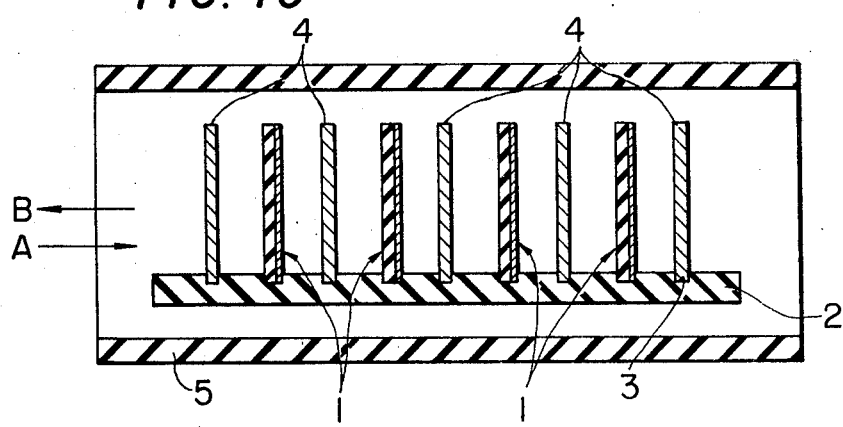
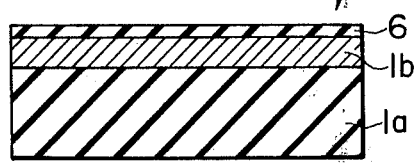
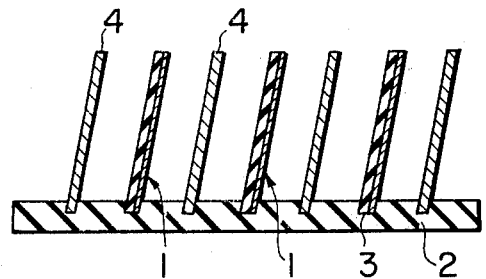

METHOD OF HEAT TREATMENT OF WAFERS

This application is a continuation-in-part of U.S. patent application Serial No. 627,368, filed on Oct. 30, 1975 now abandoned.

BACKGROUND OF THE INVENTION

1. Field of the Invention

This invention relates to a method of heat treatment of wafers which are formed of a substance of poor heat conduction such as sapphire and spinel. It is chiefly devoted to a method of heat treatment for the oxidation or impurity diffusion of the so-called SOS (Silicon on Sapphire) wafers in which a single crystal silicon layer is formed on the surface of a sapphire substrate.

2. Description of the Prior Art

Likewise to the treatment of semiconductor wafers (for example, Si wafers), the heat treatment of the SOS wafers is conducted under the state under which many wafers are erected at equal intervals on recesses in a wafer jig within a heat treatment furnace. In such method, cracks often arise in the wafers when they are introduced into the heat treatment furnace and drawn out therefrom.

The wafer cracks can be prevented to some extent in such way that the wafers to be processed are slowly introduced into and drawn out from the heat treatment furnace. On the other hand, however, where the heat treatment is made in large amounts, the wafers differ largely in the thermal hysteresis and do not become uniform in characteristics.

In the prior art, therefore, it has been very difficult to prevent the wafer cracks from occurring and to lessen a dispersion in the characteristics of the respective wafers in case where the SOS wafers are heat-treated in mass production.

SUMMARY OF THE INVENTION

This invention has solved the difficult problem as stated above, and has for its object to prevent the cracks of wafers and make the characteristics of the respective wafers uniform in case of performing heat treatment for oxidation, diffusion etc. in mass production.

The fundamental construction of this invention for accomplishing the object consists in a method of heat treatment of wafers wherein heat treatment for oxidation, diffusion etc. is carried out under the state under which a number of wafers to-be-treated being poor in the heat conduction are erected, characterized in that the heat treatment is executed under the state under which the wafers-to-be-treated being poor in the heat conduction and auxiliary wafers being good in the heat conduction are arranged alternately in proximity.

BRIEF DESCRIPTION OF THE DRAWING

FIGS. 1A to 1D are vertical sections showing an embodiment of this invention, while FIG. 2 is a vertical section showing another embodiment of this invention.

PREFERRED EMBODIMENTS OF THE INVENTION

Hereunder this invention will be concretely explained with reference to the drawings.

FIGS. 1A to 1D illustrate an embodiment of this invention in the case where SOS wafers are subjected to heat treatment so as to form a thermal oxidation film on the surface of each wafer.

As shown in FIG. 1A, an SOS wafer 1 is prepared which consists of a sapphire substrate 1a having a thickness of about 300 $\mu$ and a single crystal silicon layer 1b formed on the surface of the sapphire substrate and having a thickness of about 1 $\mu$.

Subsequently, as shown in FIG. 1B, the SOS wafers 1 and auxiliary wafers formed of a substance of good heat conduction (for example, Si wafers having a thickness of about 300 $\mu$) 4 are alternately and vertically erected on recesses 3 which are provided at intervals of about 5 mm in a wafer jig 2 made of quartz. The wafers to be processed and the auxiliary wafers are so arranged that the SOS wafer 1 intervenes between two of the Si wafers 4. The wafer jig may also be formed of silicon. A range of the spacing is dependent on the auxiliary wafer material and a diameter of the poor heat conduction wafer. Generally the range is selected from 2 to 30 millimeter. In case of combination of silicon wafer and sapphire wafer for example where the diameters of sapphire are 50, 60, and 75 millimeter, the spacings are selected at least to be of 10, 20 and 30 millimeter respectively. The size of the auxiliary wafer is generally selected to the extent of ½ to 1½ times to the poor heat conduction wafer. Typically value is the same size.

Subsequently, as shown in FIG. 1C, the wafer jig 2 with the SOS wafers 1 and the Si wafers 4 placed thereon is introduced into a heat treatment furnace 5 of an $O_2$-gas atmosphere heated to about 1,050° C., at a high speed of about 120 cm/min as indicated by arrow A. The heat treatment is executed for 10 minutes. Thereafter, the wafer jig 2 is drawn out of the heat treatment furnace 5 at the same speed of about 120 cm/min as the introducing speed as indicated by arrow B.

In this way, as shown in FIG. 1D, and SOS wafer 7 in which $SIO_2$ 6 having a thickness of approximately 1,000 A is formed on the single crystal silicon layer 1b can be acquired without causing any crack in the SOS wafer.

According to this invention as explained above in connection with the embodiment, in heat-treating the SOS wafers of poor heat conduction, the SOS wafers and the Si wafers of good heat conduction are arranged alternately in proximity. Therefore, at the heat treatment, especially at the introduction of the SOS wafers into the heat treatment furnace and the drawing-out from the same, the sapphire substrates of poor heat conduction are affected by quick temperature changes of the proximate Si wafers of good heat conduction, and the whole SOS wafers and the whole wafer areas can be uniformly heated or cooled in a short time in a manner to follow up the changes. It is accordingly avoided that the SOS wafers are locally heated or cooled, so that the cracks of the SOS wafers can be prevented substantially perfectly.

Even when the SOS wafers are simultaneously treated in large amounts, all the SOS wafers are uniformly heated or cooled in a short time, and hence, the thermal hysteresis do not differ among the SOS wafers. It is accordingly possible to obtain the SOS wafers of uniform characteristics in mass production.

Although this invention has been explained above along the embodiment in the case of forming the thermal oxidation film on the surface of the SOS wafer, it is also applicable to the heat treatment at the time when an impurity is diffused into selected areas of the single crystal silicon layer 1b by employing the SiO$_2$ 6 as a mask or to any other heat treatment of the SOS wafer.

This invention is not restricted to the foregoing embodiment. By way of example, as illustrated in FIG. 2, the treatment may be carried out by arranging the SOS wafers 1 and the Si wafers 4 on the wafer jig alternately and under an inclined state. Although not shown, the SOS wafers and the Si wafers may be disposed alternately, in proximity and in parallel along the flow of a gas inside the heat treatment furnace. The auxiliary wafer is not restricted to the Si wafer, but it may be any wafer of good heat conduction, for example, a metal wafer.

While this invention is suitable chiefly for the heat treatment for the oxidation, diffusion etc. of the SOS wafer, it is also applicable to the heat treatment of a garnet wafer in which a single crystal semiconductor layer is formed on the surface of a garnet substrate, as well as a spinel wafer in which a single crystal semiconductor layer is formed on the surface of a spinel substrate, and to the heat treatment of any other wafer of poor heat conduction as formed merely of a substance of poor heat conduction.

What is claimed is:

1. In a method of heat-treating a number of wafers each of which consists of a substance of poor heat conduction and a semiconductor layer formed on one surface thereof, said method of heat treatment of wafers comprising the fact that the treatment is performed under the state under which an auxiliary wafer made of a substance of good heat conduction is held in proximity to that surface of said substance of poor heat conduction which is opposite to said one surface.

2. The method of heat treatment of wafers according to claim 1, wherein said substance of poor heat conduction is sapphire, while said semiconductor layer formed on one surface thereof is made of silicon single crystal.

3. The method of heat treatment of wafers according to claim 2, wherein said auxiliary wafer is made of silicon.

4. The method of heat treatment of wafers according to claim 3, wherein a spacing between said wafer of poor heat conduction and said auxiliary wafer of good heat conduction is about 5 mm.

5. In a method of heat-treating a number of wafers each of which consists of a substance of poor heat conduction and a semiconductor layer formed on one surface thereof, said method of heat treatment of wafers comprising the fact that the heat treatment is performed under the state under which the wafers of poor heat conduction and auxiliary wafers of good heat conduction are erected on a wafer jig alternately and in proximity.

6. The method of heat treatment of wafers according to claim 5, wherein said wafers of poor heat conduction and said wafers of good heat conduction are erected at respectively equal intervals and orthogonally to said wafer jig.

7. The method of heat treatment of wafers according to claim 5, wherein said wafers of poor heat conduction and said wafers of good heat conduction are erected at respectively equal intervals and aslant against said wafer jig.

8. The method of heat treatment of wafers according to claim 1, wherein the space between said wafer of poor heat conduction and said auxiliary wafer of good heat conduction is 2 to 30 millimeters.

* * * * *